(12) United States Patent
White (10) Patent No.: US 11,520,445 B1
(45) Date of Patent: Dec. 6, 2022

(54) APPLIANCE WITH MODULAR USER INTERFACE

(71) Applicant: Haier US Appliance Solutions, Inc., Wilmington, DE (US)

(72) Inventor: Robert Turner White, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 0 days.

(21) Appl. No.: 17/376,718

(22) Filed: Jul. 15, 2021

(51) Int. Cl.
| | |
|---|---|
| *G06F 3/043* | (2006.01) |
| *F24C 3/12* | (2006.01) |
| *F24C 7/08* | (2006.01) |
| *G06F 3/044* | (2006.01) |
| *H05K 1/09* | (2006.01) |
| *F21V 8/00* | (2006.01) |

(52) U.S. Cl.
CPC ............ *G06F 3/0443* (2019.05); *F24C 3/126* (2013.01); *F24C 7/086* (2013.01); *G02B 6/0073* (2013.01); *H05K 1/092* (2013.01)

(58) Field of Classification Search
CPC ........ G06F 3/0443; F24C 3/126; F24C 7/086; G02B 6/0073; H05K 1/092
See application file for complete search history.

(56) References Cited

U.S. PATENT DOCUMENTS

| | | | |
|---|---|---|---|
| 5,818,428 A | 10/1998 | Eisenbrandt | |
| 8,053,708 B2 | 11/2011 | Fisher | |
| 8,581,133 B2 | 11/2013 | Frommelt | |
| 9,179,554 B2 | 11/2015 | Schuh | |
| 9,690,440 B2 | 6/2017 | Lee | |
| 10,209,838 B2 | 2/2019 | Franziska | |
| 10,578,310 B2 * | 3/2020 | Joo | ......................... F24C 7/088 |
| 2009/0090611 A1 | 4/2009 | Anders | |
| 2011/0148773 A1* | 6/2011 | Rudolph | ................ H03K 17/96 345/173 |
| 2011/0273375 A1* | 11/2011 | Wilford | ............... H03K 17/962 345/173 |
| 2016/0120028 A1* | 4/2016 | Bach | ....................... F24C 7/086 345/174 |
| 2018/0373350 A1* | 12/2018 | Rao | ......................... G06F 3/038 |

FOREIGN PATENT DOCUMENTS

DE        102010030315 A1     12/2011

* cited by examiner

*Primary Examiner* — Bryan Earles
(74) *Attorney, Agent, or Firm* — Dority & Manning, P.A.

(57) ABSTRACT

A modular user interface unit for an appliance is provided. The modular user interface unit includes an upper film layer comprising a conductive polymer and a plurality of electrodes. The modular user interface unit also includes a circuit board with a microcontroller thereon. The circuit board is electrically coupled to the upper film layer by a conductive polymer connector. The microcontroller is configured to receive raw capacitance data from the plurality of electrodes and to detect a touch based on the raw capacitance data.

18 Claims, 5 Drawing Sheets

APPLIANCE WITH MODULAR USER INTERFACE

FIELD

The present subject matter relates generally to user interfaces, such as may be used in control panels for appliances.

BACKGROUND

Appliances generally include a control panel having a plurality of buttons, keys, or other input devices. Utilizing the control panel, an appliance user can input control commands to the appliance and operate the appliance. Certain control panels include capacitive touch sensors that utilize a user's body capacitance to operate. In particular, capacitive touch sensors can detect a change in capacitance when the user touches the control panel.

Capacitive touch sensors have various benefits. For example, capacitive touch sensors can assist with providing a clean appearance for an associated appliance. In particular, capacitive touch sensors are frequently positioned behind a dielectric panel. A user touches an outer surface of the dielectric panel opposite the capacitive touch sensors to actuate the capacitive touch sensors. The smooth outer surface can have a pleasant cosmetic appearance, e.g., particularly compared to tactile buttons, knobs, etc.

Capacitive touch sensors also can be more complex than other inputs, such as mechanical knobs. For example, capacitive touch sensors generally include electrodes for sensing or measuring capacitance that are disposed on an inner surface of the dielectric panel opposite the outer surface of the dielectric panel. The electrodes may be attached to or embedded in a film layer, which provides a compact assembly due to the thinness of the film layer. The film layer with the electrodes embedded therein is connected to a circuit board which includes a controller thereon that processes the sensed or measured capacitance.

In some capacitive touch interfaces, the film layer is connected to the circuit board by flexible connectors such as flexible printed circuit connectors or flexible ribbon cables. Such connectors are suitable for transmitting the quantity of capacitance data generated, but are relatively expensive compared to other connectors.

In some capacitive touch interfaces, the film layer may be irreversibly bonded, such as with adhesive, to the circuit board. In such cases, when any one electrode or any other single piece of the film is out of specification, the entire user interface assembly, including the entire circuit board (to which the film layer is bonded) for the whole assembly, must be scrapped.

Accordingly, a user interface assembly including one or more modular user interface units that addresses one or more of the foregoing issues would be useful.

BRIEF DESCRIPTION

Aspects and advantages of the technology will be set forth in part in the following description, or may be apparent from the description, or may be learned through practice of the technology.

In an exemplary embodiment, user interface assembly for an appliance is provided. The user interface assembly includes a dielectric panel, a main circuit board, and a plurality of modular user interface units. The plurality of modular user interface units are each coupled to the main circuit board. Each modular user interface unit includes an upper film layer comprising a conductive polymer and a plurality of electrodes. Each modular user interface unit also includes a circuit board with a microcontroller thereon. The circuit board is electrically coupled to the upper film layer by a conductive polymer connector. The microcontroller is configured to receive raw capacitance data from the plurality of electrodes and to detect a touch based on the raw capacitance data.

In another exemplary embodiment, a modular user interface unit for an appliance is provided. The modular user interface unit includes an upper film layer comprising a conductive polymer and a plurality of electrodes. The modular user interface unit also includes a circuit board with a microcontroller thereon. The circuit board is electrically coupled to the upper film layer by a conductive polymer connector. The microcontroller is configured to receive raw capacitance data from the plurality of electrodes and to detect a touch based on the raw capacitance data.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures.

DETAILED DESCRIPTION

Reference now will be made in detail to embodiments of the technology, one or more examples of which are illustrated in the drawings. Each example is provided by way of explanation of the technology, not limitation of the technology. In fact, it will be apparent to those skilled in the art that various modifications and variations can be made in the present technology without departing from the scope or spirit of the technology. For instance, features illustrated or described as part of one embodiment can be used with another embodiment to yield a still further embodiment. Thus, it is intended that the present technology covers such modifications and variations as come within the scope of the appended claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the terms "first," "second," and "third" may be used interchangeably to distinguish one component from another and are not intended to signify location or importance of the individual components. As used herein, terms of approximation, such as "generally," or "about" include values within ten percent greater or less than the stated value. When used in the context of an angle or direction, such terms include within ten degrees greater or less than the stated angle or direction. For example, "generally vertical" includes directions within ten degrees of vertical in any direction, e.g., clockwise or counter-clockwise.

Figure 1:
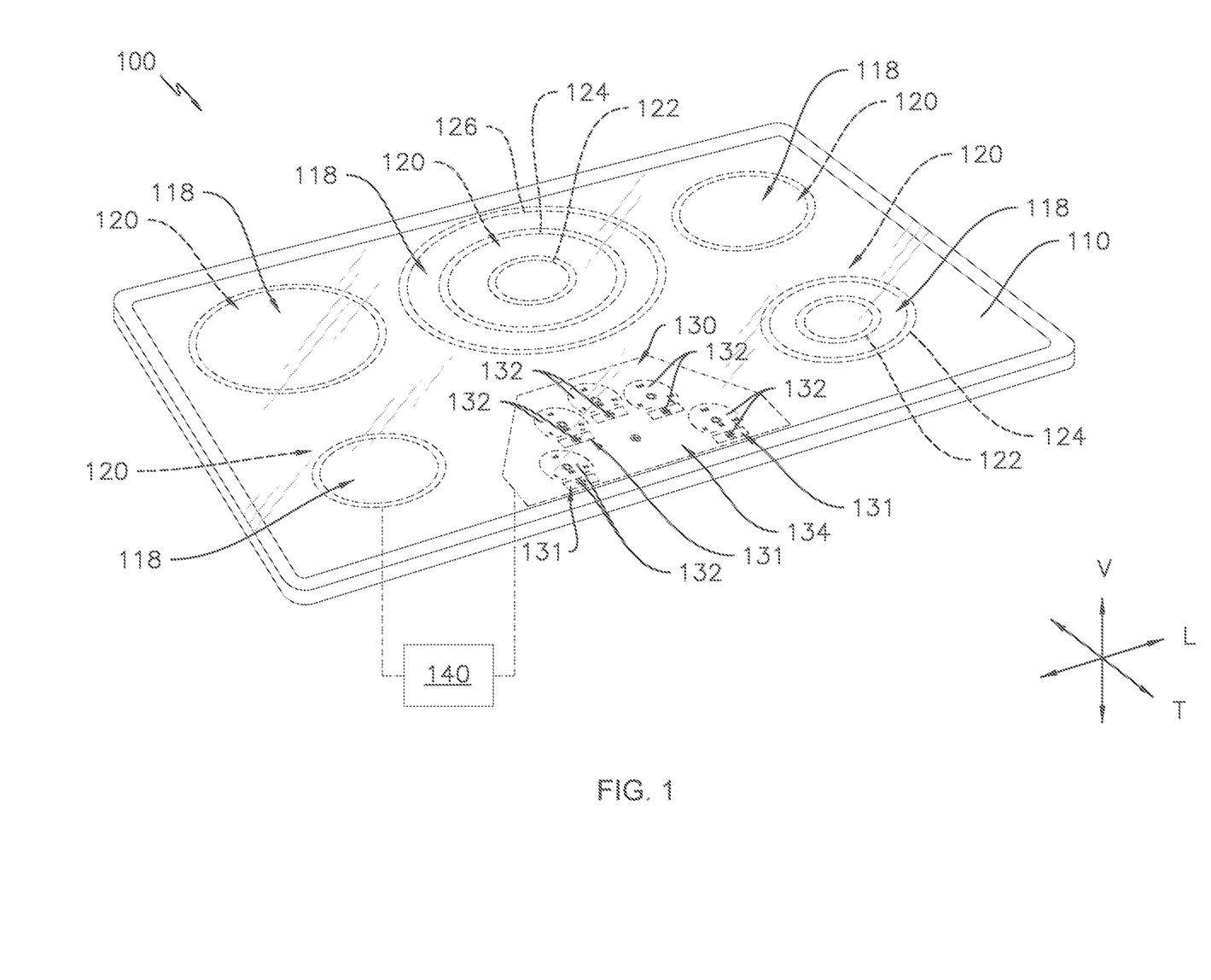
FIG. 1 provides a top perspective view of a cooktop appliance as may incorporate a user interface assembly and/or one or more modular user interface units in accordance with at least one embodiment of the present subject matter.

FIG. 1 provides a top, perspective view of a cooktop appliance 100 according to an exemplary embodiment of the present subject matter. Cooktop appliance 100 can be installed in various locations such as in cabinetry or a countertop in a kitchen, with one or more ovens to form a range appliance, or as a standalone appliance. Thus, as used herein, the term "cooktop appliance" includes grill appliances, stove appliances, range appliances, and other appliances that incorporate cooktops, which are generally known as surface cooking appliances. It should be understood that the present disclosure is not limited to cooktop appliances 100, and rather that any suitable appliance having a user input assembly is within the scope and spirit of the present disclosure.

Cooktop appliance 100 includes a cooking panel 110 for supporting cooking utensils such as pots or pans thereon. Cooking panel 110 is a generally transparent material that may be constructed from, e.g., glass, ceramics, and/or combinations thereof.

Cooking panel 110 may include one or more cooking zones 118. As shown in FIG. 1, cooking zones 118 may be generally circular in shape and may have various diameters. For example, each cooking zone 118 can have a different diameter, the same diameter, or any suitable combination thereof. In other embodiments, cooking zones 118 may be generally rectangular in shape, and each cooking zone 118 may have the same length and width, a different length and width, or any suitable combination thereof. In still other embodiments, cooking zones 118 may have any suitable shape and size, and in some embodiments, cooking panel 110 may include cooking zones 118 of various shapes and sizes, e.g., a combination of circular and rectangular cooking zones 118. Further, while shown with five cooking zones 118 in the exemplary embodiment of FIG. 1, in alternative exemplary embodiments, cooktop appliance 100 may include any number of cooking zones 118.

A heating assembly 120 is mounted below cooking panel 110 adjacent each cooking zone 118 such that heating assemblies 120 are positioned below cooking panel 110, e.g., along a vertical direction V. Each heating assembly 120 may comprise a single heating element or a plurality of heating elements or sub-elements, such as a first heating element 122, a second heating element 124, and/or a third heating element 126 as shown in FIG. 1, with each heating element or sub-element contributing to the power density of the respective cooking zone 118. For each heating assembly having more than one heating element, heating elements 122, 124, and/or 126 may be activated individually or in conjunction with one or both of the other heating elements 122, 124, 126. For example, for a given heating assembly 120, first heating element 122 may be activated individually, with second heating element 124, with third heating element 126, or with both second heating element 124 and third heating element 126. As an additional example, for a heating assembly 120 comprising two heating elements, such as first heating element 122 and second heating element 124, both heating elements 122, 124 may be activated individually or simultaneously. Thus, using heating assemblies 120 having multiple heating elements, cooking zones 118 may vary in size and/or power density.

Cooktop appliance 100 is provided by way of example only and is not limited to the exemplary embodiment shown in FIG. 1. For example, a cooktop appliance having one or more heating assemblies in combination with one or more electric or gas burner heating elements can be provided. In addition, various combinations of number of heating assemblies, position of heating assemblies, and/or size of heating assemblies can be provided. Moreover, heating assemblies 120 can have a variety of constructions for the input of energy in the form of heat to the cooking utensils. For example, heating assemblies 120 can be constructed as electric radiant, gas-on-glass, or induction heating sources. Mechanisms associated with each such type of heating source are positioned under cooking panel 110 adjacent cooking zones 118 and will be well understood of one of skill in the art using the teachings disclosed herein.

A touch pad or touch screen 130 provides visual information to a user and allows a user to select various options for the operation of cooktop appliance 100. For example, touch screen 130 may include a selection portion 131 for each cooking zone 118, and within selection portion 131, a user may select which heating element or elements of the associated heating assembly 120 the user desires to be activated and information may be displayed to the user such as, e.g., which heating element or elements is active and/or at what size or power density has been selected for cooking zone 118. Each selection portion 131 may include one or more user input components. More particularly, as shown in the exemplary embodiment of FIG. 1, the user input component(s) of each selection portion may be one or more capacitive touch input components 132, which can be used as part of a capacitive touch sensing system to allow for the selective activation, adjustment, or control of any or all heating assemblies 120. Touch input components 132 may also be provided for the selective activation, adjustment, or control of any timer features or other user adjustable inputs. In particular, and as will be described in more detail below, each selection portion 131 may correspond to an individual modular user interface unit. One or more of a variety of electrical, mechanical or electro-mechanical input devices including rotary dials, push buttons, toggle/rocker switches, and/or touch pads can also be used singularly or in combination with touch input components 132. Touch screen 130 also includes a display component 134, such as a digital or analog display device designed to provide operational feedback to a user. Selection portion 131 of touch screen 130 is further described below.

Touch screen 130 can be any type of input device and can have any configuration. In FIG. 1, touch screen 130 is located within a portion of cooking panel 110. Alternatively, touch screen 130 can be positioned on a vertical surface near a front side of cooktop appliance 100 or anywhere convenient for a user to access during operation of cooktop appliance 100. In some embodiments, cooktop appliance 100 may be a range cooktop, and in such embodiments, touch screen 130 may be positioned on, e.g., a backsplash of the range.

Also, although described with respect to cooktop appliance 100, it should be readily understood that touch screen 130 as described herein could be used with any suitable appliance. When used with other appliances, such as, e.g., washing machine appliances, dryer appliances, and/or refrigerator appliances, panel 110 may be constructed of glass, ceramics, plastics, and/or combinations thereof. Suitable plastic materials may include acrylics, polyethylene terephthalate ("PET"), or the like. In some embodiments, touch screen 130 may be incorporated into or may form the control panel of an appliance; for example, touch screen 130 may be incorporated into a backsplash of a washing machine or dryer appliance.

Operation of cooktop appliance 100 can be regulated by a controller 140 that is operatively coupled, i.e., in communication with, touch screen 130 and heating assemblies 120, including first heating elements 122, second heating elements 124, and third heating elements 126. For example, in response to user manipulation of a touch input component 132, the controller operates one of heating assemblies 120, e.g., by operating one or more of heating elements 122, 124, 126. The controller is also provided with other features. By way of example, the controller may include a memory and one or more processing devices such as microprocessors, CPUs or the like, such as general or special purpose microprocessors operable to execute programming instructions or micro-control code associated with operation of appliance 100. The memory may represent random access memory such as DRAM, or read only memory such as ROM or FLASH. The memory may be a separate component from the processor or may be included onboard within the processor. In one embodiment, the processor executes programming instructions stored in memory. It should be noted that controllers 140 as disclosed herein are capable of and may be operable to perform any methods and associated method steps as disclosed herein. For example, in some embodiment, methods disclosed herein may be embodied in programming instructions stored in the memory and executed by the controller 140.

The controller 140 may be positioned in a variety of locations throughout cooktop appliance 100. In the illustrated embodiment, the controller may be located under or next to the touch screen 130. In such an embodiment, input/output ("I/O") signals are routed between the controller and various operational components of appliance 100 such heating assemblies 120, touch input components 132, sensors, graphical displays, and/or one or more alarms. In one embodiment, the touch screen 130 may represent a general purpose I/O ("GPIO") device or functional block. Touch screen 130 may be in communication with the controller via one or more signal lines or shared communication busses.

Figure 2:
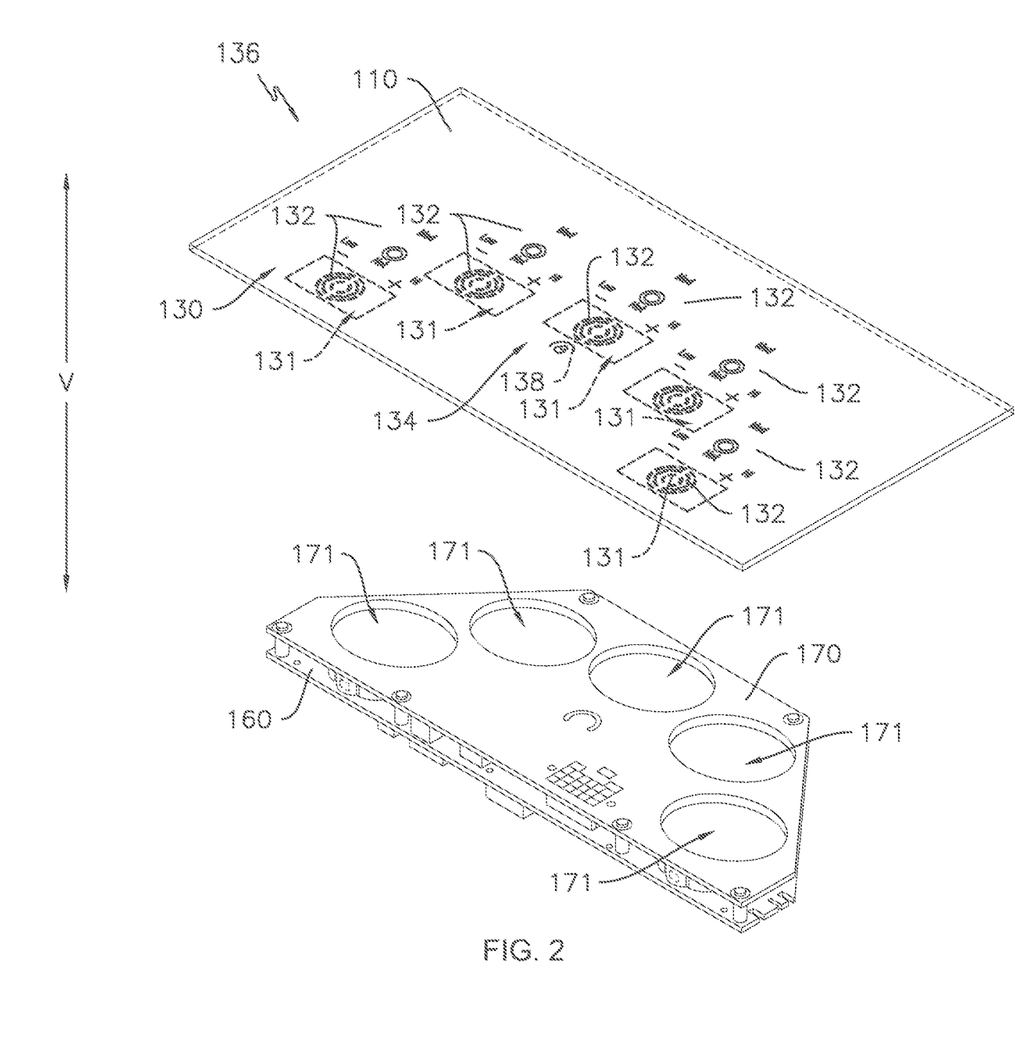
FIG. 2 provides an exploded view of a user interface assembly of the cooktop appliance of FIG. 1 according to one or more exemplary embodiments of the present subject matter.

FIG. 2 illustrates an exploded view of a user interface assembly 136 of cooktop 100. As shown, a user of cooktop appliance 100 may input and receive information regarding the operation of cooktop 100 at touch screen 130, which is a portion of cooking panel 110 and is also a component of the user interface assembly 136, e.g., a dielectric panel of the user interface assembly 136. A variety of text, digits, and/or symbols may be printed on touch screen 130 to indicate, e.g., the operation of a cooking zone 118 or the area of touch screen 130 to touch to input certain information. In alternative embodiments, no text, digits, or symbols may appear on touch screen 130 unless cooktop 100 is in use.

Figure 3:
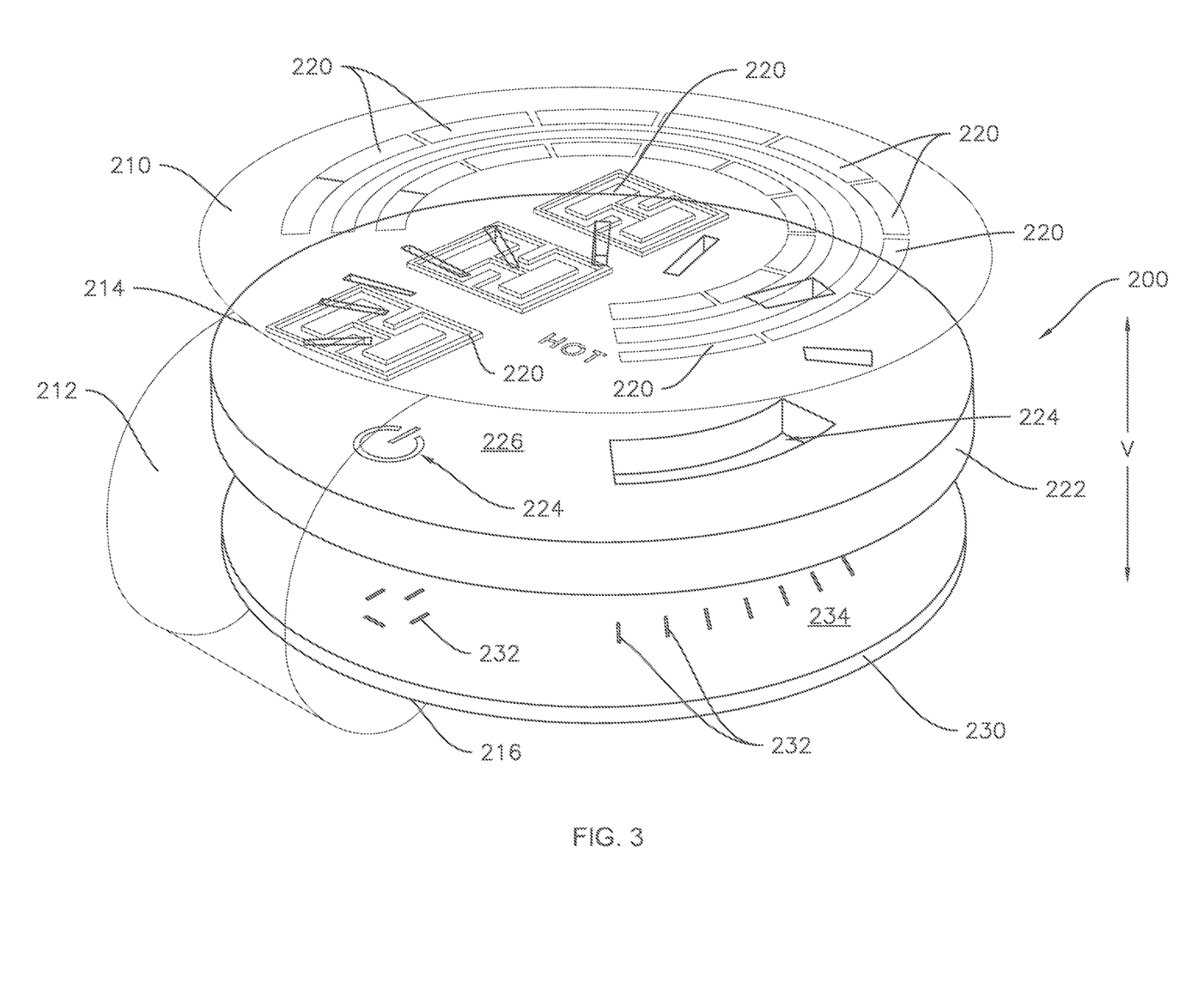
FIG. 3 provides an exploded top perspective view of a modular user interface unit according to one or more exemplary embodiments of the present subject matter which may be incorporated into a user interface assembly such as the user interface assembly of FIG. 2.
Figure 4:
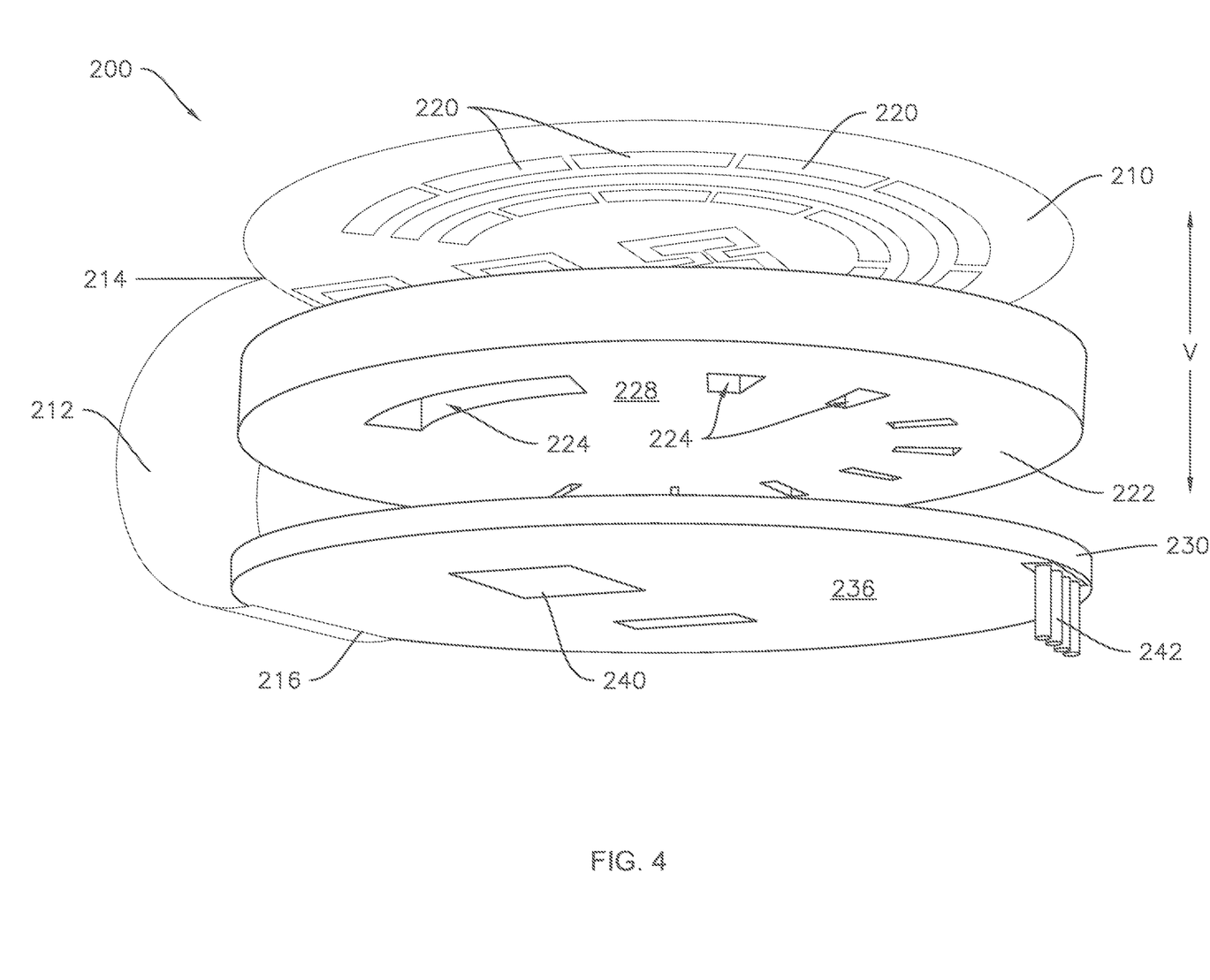
FIG. 4 provides an exploded bottom perspective view of the modular user interface unit of FIG. 3.
Figure 5:
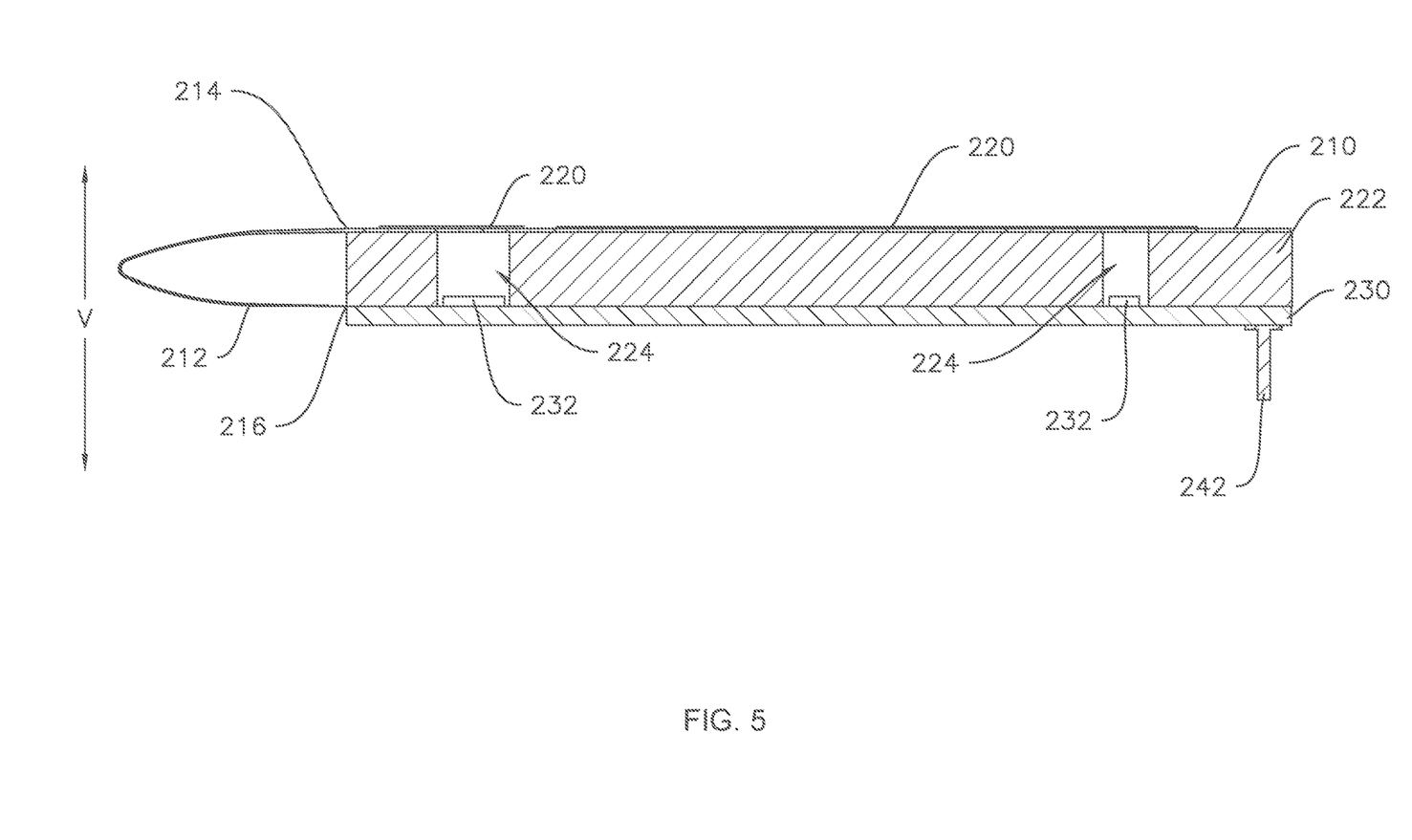
FIG. 5 provides a section view of the modular user interface unit of FIG. 3.

As shown in FIG. 2, the user interface assembly 136 includes a main circuit board, which in the illustrated example embodiments comprises a first printed circuit board 160 positioned below touch screen 130 along the vertical direction V and a second printed circuit board 170 positioned above first printed circuit board 160 but below touch screen 130 along vertical direction V. The main circuit board, e.g., second printed circuit board 170 and/or first printed circuit board 160 in embodiments such as the exemplary embodiment illustrated in FIG. 2, may include a plurality of apertures 171 defined in and through the main circuit board. Such apertures 171 may be configured and adapted to each receive a corresponding one of a plurality of modular user interface units 200 (FIGS. 3 through 5). As an example of such configuration of the apertures 171, the apertures 171 may be sized and shaped correspondingly to the modular user interface units 200, e.g., as in the illustrated exemplary embodiments the modular user interface units 200 may each have a circular cross-section, e.g., may each be cylindrical, and the apertures 171 may have a correspondingly shaped circular cross-section, where an inner diameter of each aperture 171 is approximately equal to an outer diameter of each modular user interface unit 200. When one or more of the modular user interface units 200 are plugged into the main circuit board, a capacitive touch sensing system may, in some embodiments, be thereby formed, whereby cooktop 100 is controlled at least in part through touch inputs on touch screen 130 by a user of cooktop 100, e.g., through capacitive touch input components 132.

Referring again to FIG. 1, selection portion 131 may be or may include a capacitive touch input component 132. A touch input component 132 may correspond to a portion of a modular user interface unit 200 and/or a portion of a printed circuit board 230 of the modular user interface unit 200, such that a touch input to selection portion 131 adjacent that portion activates, deactivates, or controls one or more features, functions, or the like of cooktop 100, e.g., where the touch may be detected or registered through a change in capacitance at a corresponding electrode 220 on the modular user interface unit 200 which is aligned with the touch input component 132.

More particularly, the capacitive touch sensing system, e.g., each modular user interface unit 200 thereof that is coupled to, e.g., plugged into, the main circuit board, may be in operative communication with each heating assembly 120 to activate and deactivate heating elements 122, 124, 126 to vary the size and/or power density of each cooking zone 118.

Although described above as utilizing two printed circuit boards 160, 170, in alternative exemplary embodiments, the elements of the two circuit boards may be combined such that the main circuit board of the user interface assembly 136 consists of only one printed circuit board. For example, user interface assembly 136 may include touch screen 130 and the main circuit board, e.g., the first printed circuit board 160 alone, positioned below touch screen 130 along the vertical direction V. In this exemplary embodiment, first printed circuit board 160 includes the apertures 171 as described above.

It should be understood that the present disclosure is not limited to the above-described cooktop appliance 100; user interface assembly 136 may be utilized for any suitable appliance where a capacitive-based touch assembly is desired. Additionally, it should be understood that the descriptions herein of an appliance are but one example of a possible field of use for the capacitive touch sensors and related methods.

Turning now generally to FIGS. 3 through 5, those of ordinary skill in the art will recognize that each modular user interface unit 200 comprises one or more capacitive touch sensor(s). The or each capacitive touch sensor may include an electrode. For example, the appliance may include a controller, such as the controller 140 described above, in operative communication with the user interface assembly 136. In some embodiments, the controller may be configured to monitor raw count data from the capacitive touch sensor. The capacitive touch sensor, such as a microcontroller 240 (FIG. 4) thereof, may be operable to convert sensor capacitance into raw digital counts. For example, the capacitive touch sensor may include a dedicated controller 240 (FIG. 4) on-board the printed circuit board 230 which is operable to convert sensor capacitance into raw digital counts. The capacitive touch sensor may further be operable to transmit a signal containing the raw digital counts to the controller 140. Thus, the controller 140 may monitor the raw count data based on the signals received from the capacitive touch sensor, e.g., from the or each modular user interface unit 200, such as from the on-board microcontroller 240 thereof. In additional embodiments, the microcontroller 240 of the modular user interface unit 200 may perform some or all of the further processing of the raw digital counts to detect a touch, such as identifying an increase in the raw digital counts and registering a touch in response to the identified increase. In such embodiments, the microcontroller 240 may then transmit a signal that is indicative of or responsive to the registered touch to the controller 140 and/or directly to one of the heating units 120.

Additionally, it should be understood that the single modular user interface unit 200 illustrated in FIGS. 3 through 5 may be one of any number of modular user interface units 200 in the plurality of modular user interface units 200, e.g., such as five modular user interface units 200 as in the illustrated embodiment, e.g., corresponding to the five apertures 171 in the main circuit board 160 and/or 170. Moreover, given the modular nature of the system and of the units, it is to be understood that each modular user interface unit 200 is preferably identical to every other modular user interface unit 200 of the plurality of modular user interface units 200, such that, for example, any modular user interface unit 200 may be easily swapped out with another unit 200 whenever a unit 200 is damaged or otherwise is out of specification.

In some embodiments, e.g., as illustrated in FIG. 3, the or each modular user interface unit 200 my include an upper film layer 210. The upper film layer 210 may be comprised of a conductive polymer material. The electrodes of the capacitive touch sensor, as described above, may be embodied as electrodes 220 on the upper film layer 210. For example, in some embodiments, the electrodes 220 may be formed of conductive ink that is printed onto the upper film layer 210 of the modular user interface unit 200.

Still referring to FIG. 3, the modular user interface unit 200 may also include a printed circuit board 230 (sometimes also referred to as a "PCB"). The printed circuit board 230 may include an upper surface 234, e.g., which faces upwards towards the touch screen 130. A plurality of light-emitting diodes (LEDs) 232 may be arranged on the upper surface 234 of the PCB 230. In some embodiments, the modular user interface unit 200 may further include a light guide 222 positioned between the circuit board 230 and the upper film layer 210.

The upper film layer 210 may be electrically coupled to the circuit board 230 via a connector 212. For example, in some embodiments, the connector 212 may be formed of a conductive polymer. In particular embodiments, the connector 212 may be formed of a thin, flexible ribbon or strip of the conductive polymer film material. The connector 212 may be thin and flexible, e.g., whereby the connector 212 is compressible and bendable during assembly, such as when going from the position illustrated in FIGS. 3 and/or 4 to the assembled position illustrated in FIG. 5, to allow the upper film layer 210 to be easily movable relative to the light guide 222 in order to facilitate alignment of the upper film layer 210 with the light guide 222. In general, both the upper film layer 210 and the connector 212 may comprise a thin film material which is thin and flexible, e.g., such that the film material bends and/or flexes under minimal force, such as manual force applied by a person of average physical ability.

The connector 212 may, in some embodiments, extend from a first end 214 to a second end 216. The first end 214 of the connector 212 may be joined to, such as directly joined to and, in some embodiments, integrally formed with, the upper film layer 210. For example, in some embodiments, the upper film layer 210 and the connector 212 may be formed of a single, continuous piece of conductive polymer material, e.g., a single, continuous piece of conductive polymer film. The second end 216 of the connector 212 may be joined to, such as directly joined to, e.g., directly bonded to, the PCB 230. For example, the connector 212 may be adhesively bonded to the PCB 230 at the second end 216 of the connector 212, e.g., using anisotropic conductive film or optically clear adhesive. Thus, the upper film layer 210 and electrodes 220 thereof may be in electrical communication with the PCB 230 via the connector 212 without the need for a separate connector such as a ribbon cable, to provide the electrical communication. As mentioned above, a microcontroller 240 may be disposed on and electrically coupled to the PCB 230. Thus, in some example embodiments, the microcontroller 240 may be in electrical communication with the upper film layer 210 and the electrodes 220 thereof via the connector 212, e.g., whereby the microcontroller 240 receives, measures, and/or senses capacitance at the electrodes 220 on the upper film layer 210. As discussed above, the microcontroller 240 may further be configured to and operable to convert the, e.g., received, capacitance into raw digital counts. The microcontroller 240 may further be configured to and operable to detect a touch based on the raw capacitance data, such as by communicating the raw digital counts to the main controller 140 of the appliance, and/or by analyzing the raw digital counts, such as detecting an increase in the raw digital counts, and detecting a touch based thereon.

As mentioned, the modular user interface unit 200 may be configured to couple to the main circuit board. For example, as illustrated in FIGS. 4 and 5, the modular user interface unit 200 may include a pin connector 242 thereon. In some embodiments, the pin connector 242 may be coupled to the circuit board 230 of the modular user interface unit 200, such as on a lower surface 236 (e.g., opposite the upper surface 234) of the circuit board 230 of the modular user interface unit 200. Thus, the modular user interface unit 200 may be configured to couple to the main circuit board of the user interface assembly by the pin connector 242.

The light guide 222 may include an upper surface 226 (FIG. 3) and a lower surface 228 (FIG. 4). The upper and lower surfaces 226 and 228 of the light guide 222 may be oppositely oriented, e.g., facing away from each other, and may be disposed at opposite sides of the light guide 222. For example, the light guide 222 may be delineated, e.g., bounded and defined, by the upper surface 226 and the lower surface 228 along the vertical direction V. The light guide 222 may also include a plurality of apertures 224 extending therethrough, such as fully through the light guide 222 along the vertical direction V from the upper surface 226 to the lower surface 228. As illustrated for example in FIG. 5, each LED 323 of the plurality of LEDs 232 may be aligned with a corresponding aperture 224 in the light guide 222. Further, in some embodiments, the conductive polymer of the upper film layer 210 may be transparent or translucent. Each LED 232 of the plurality of LEDs 232 may thereby be in optical communication with the upper film layer 210 and the touch screen 130 via the corresponding aperture 224 in the light guide 222, e.g., whereby the LEDs transmit light to the touch screen 130 through the corresponding aperture 224 in the light guide 222.

As best seen in FIG. 5, in some embodiments, the connector 212 and the upper film layer 210 may comprise a continuous and uniform whole. For example, the upper film layer 210 may define a first thickness, the conductive polymer connector 212 may define a second thickness, and the first thickness may be approximately equal to the second thickness, such as within ten percent greater or less than the second thickness.

As mentioned, FIG. 5 illustrates the exemplary modular user interface unit 200 in an assembled position. When assembled, the lower surface 228 of the light guide 222 is mounted on the upper surface 234 of the circuit board 230 of the modular user interface unit 200, such as with the light guide 222 mounted direction on (atop) the circuit board 230 and in direct, surface-to-surface contact with the circuit board 230, e.g., with the lower surface 228 of the light guide 222 in direct contact with the upper surface 234 of the circuit board 230. Also, the upper film layer 210 may be mounted on the upper surface 226 of the light guide 222, e.g., as illustrated in FIG. 5. For example, the upper film layer 210 may be mounted directly on and in surface-to-surface contact with the light guide 222, e.g., with a lower surface of the upper film layer 210 in direct contact with the upper surface 226 of the light guide 222.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A user interface assembly for an appliance, the user interface assembly comprising:
    a dielectric panel;
    a main circuit board comprising a plurality of apertures defined therein; and
    a plurality of modular user interface units coupled to the main circuit board, each modular user interface unit of the plurality of modular interface units configured to be received in a corresponding one of the apertures in the main circuit board, each modular user interface unit of the plurality of modular interface units comprising:
        an upper film layer comprising a conductive polymer and a plurality of electrodes; and
        a circuit board comprising a microcontroller thereon, the circuit board electrically coupled to the upper film layer by a conductive polymer connector, the microcontroller configured to receive raw capacitance data from the plurality of electrodes and to detect a touch based on the raw capacitance data.

2. The user interface assembly of claim 1, wherein the conductive polymer connector of each modular user interface unit is directly bonded to the circuit board of the modular user interface unit.

3. The user interface assembly of claim 1, wherein each modular user interface unit further comprises a pin connector on the circuit board of the modular user interface unit, the pin connector configured to couple the modular user interface unit to the main circuit board of the user interface assembly.

4. The user interface assembly of claim 1, wherein the conductive polymer connector of each modular user interface unit is integrally formed with the conductive polymer of the upper film layer of the modular user interface unit.

5. The user interface assembly of claim 1, wherein the conductive polymer connector of each modular user interface unit comprises a single thin and flexible ribbon formed of the conductive polymer, the single thin and flexible ribbon extending from a first end directly joined to the upper film layer of the modular user interface unit to a second end directly joined to the circuit board of the modular user interface unit.

6. The user interface assembly of claim 1, wherein the upper film layer of each modular user interface unit defines a first thickness, the conductive polymer connector of the modular user interface unit defines a second thickness, and the first thickness is approximately equal to the second thickness.

7. The user interface assembly of claim 1, wherein the plurality of electrodes of each modular user interface unit are formed of conductive ink printed on the conductive polymer of the upper film layer of the modular user interface unit.

8. The user interface assembly of claim 1, wherein each modular user interface unit further comprises a light guide between the circuit board and the upper film layer.

9. The user interface assembly of claim 8, wherein each modular user interface unit further comprises a plurality of LEDs on an upper surface of the circuit board, each LED of the plurality of LEDs aligned with a corresponding aperture in the light guide of the modular user interface unit, wherein the conductive polymer of the upper film layer of the modular user interface unit is transparent, and wherein each LED of the plurality of LEDs of the modular user interface unit transmits light to a touch screen of the user interface assembly via each corresponding aperture in the light guide of the modular user interface unit and the upper film layer of the modular user interface unit.

10. A modular user interface unit for an appliance, the modular user interface unit comprising:
    an upper film layer comprising a conductive polymer and a plurality of electrodes; and
    a circuit board comprising a microcontroller thereon, the circuit board electrically coupled to the upper film layer by a conductive polymer connector, the microcontroller configured to receive raw capacitance data from the plurality of electrodes and to detect a touch based on the raw capacitance data,
    wherein the modular user interface unit is configured to be received in an aperture in a main circuit board of a user interface assembly.

11. The modular user interface unit of claim 10, wherein the conductive polymer connector is directly bonded to the circuit board.

12. The modular user interface unit of claim 10, further comprising a pin connector on the circuit board, the pin connector configured to couple the modular user interface unit to a main circuit board of a user interface assembly.

13. The modular user interface unit of claim 10, wherein the conductive polymer connector is integrally formed with the conductive polymer of the upper film layer.

14. The modular user interface unit of claim 10, wherein the conductive polymer connector comprises a single thin and flexible ribbon formed of the conductive polymer, the single thin and flexible ribbon extending from a first end directly joined to the upper film layer to a second end directly joined to the circuit board.

15. The modular user interface unit of claim 10, wherein the upper film layer defines a first thickness, the conductive polymer connector defines a second thickness, and the first thickness is approximately equal to the second thickness.

16. The modular user interface unit of claim 10, wherein the plurality of electrodes are formed of conductive ink printed on the conductive polymer of the upper film layer.

17. The modular user interface unit of claim 10, further comprising a light guide between the circuit board and the upper film layer.

18. The modular user interface unit of claim 17, further comprising a plurality of LEDs on an upper surface of the circuit board, each LED of the plurality of LEDs aligned with a corresponding aperture in the light guide, wherein the conductive polymer of the upper film layer is transparent, and wherein each LED of the plurality of LEDs transmits light to the upper film layer via each corresponding aperture in the light guide.

\* \* \* \* \*